(12) United States Patent
Xu (10) Patent No.: US 11,056,465 B2
(45) Date of Patent: Jul. 6, 2021

(54) SEMICONDUCTOR PACKAGE HAVING SINGULAR WIRE BOND ON BONDING PADS

(71) Applicant: Intel Corporation, Santa Clara, CA (US)

(72) Inventor: Yi Xu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/349,096

(22) PCT Filed: Dec. 29, 2016

(86) PCT No.: PCT/US2016/069304
§ 371 (c)(1),
(2) Date: May 10, 2019

(87) PCT Pub. No.: WO2018/125159
PCT Pub. Date: Jul. 5, 2018

(65) Prior Publication Data
US 2019/0273067 A1 Sep. 5, 2019

(51) Int. Cl.
*H01L 25/065* (2006.01)
*H01L 25/18* (2006.01)
(Continued)

(52) U.S. Cl.
CPC .......... *H01L 25/0657* (2013.01); *H01L 21/56* (2013.01); *H01L 21/561* (2013.01);
(Continued)

(58) Field of Classification Search
CPC .................. H01L 24/42; H01L 24/20; H01L 2225/06506; H01L 2225/0651; H01L 25/0657; H01L 23/3107
See application file for complete search history.

(56) References Cited

U.S. PATENT DOCUMENTS

2004/0251523 A1  12/2004  Takiar
2010/0276813 A1  11/2010  Belanger et al.
(Continued)

FOREIGN PATENT DOCUMENTS

WO  WO-2016-049940  4/2016

OTHER PUBLICATIONS

International Search Report and Written Opinion for International Patent Application No. PCT/US2016/069304 dated Jul. 11, 2019, 9 pages.
(Continued)

*Primary Examiner* — Selim U Ahmed
*Assistant Examiner* — Evan G Clinton
(74) *Attorney, Agent, or Firm* — Schwabe, Williamson & Wyatt, P.C.

(57) ABSTRACT

Semiconductor packages including active die stacks, and methods of fabricating such semiconductor packages, are described. In an example, a semiconductor package includes an active die having a top surface covered by a molding compound, and a bonding pad attached to only one interconnect wire. A method of fabricating the semiconductor package includes bridging a pair of dies stacks by the interconnect wire, and dividing the interconnect wire to form separate wire segments attached to respective die stacks.

20 Claims, 8 Drawing Sheets

(51) Int. Cl.
    *H01L 25/00*    (2006.01)
    *H01L 23/00*    (2006.01)
    *H01L 23/31*    (2006.01)
    *H01L 21/56*    (2006.01)

(52) U.S. Cl.
    CPC .............. *H01L 23/00* (2013.01); *H01L 23/31* (2013.01); *H01L 23/3107* (2013.01); *H01L 24/02* (2013.01); *H01L 24/19* (2013.01); *H01L 24/20* (2013.01); *H01L 24/42* (2013.01); *H01L 24/97* (2013.01); *H01L 25/065* (2013.01); *H01L 25/18* (2013.01); *H01L 25/50* (2013.01); *H01L 21/568* (2013.01); *H01L 24/13* (2013.01); *H01L 2224/0233* (2013.01); *H01L 2224/0235* (2013.01); *H01L 2224/02319* (2013.01); *H01L 2224/02321* (2013.01); *H01L 2224/02381* (2013.01); *H01L 2224/0401* (2013.01); *H01L 2224/04105* (2013.01); *H01L 2224/05553* (2013.01); *H01L 2224/06165* (2013.01); *H01L 2224/12105* (2013.01); *H01L 2224/18* (2013.01); *H01L 2224/19* (2013.01); *H01L 2224/2101* (2013.01); *H01L 2224/221* (2013.01); *H01L 2224/32145* (2013.01); *H01L 2224/48091* (2013.01); *H01L 2224/48145* (2013.01); *H01L 2224/97* (2013.01); *H01L 2225/06506* (2013.01); *H01L 2225/06562* (2013.01); *H01L 2225/06586* (2013.01); *H01L 2924/00014* (2013.01)

(56) References Cited

U.S. PATENT DOCUMENTS

| | | | |
|---|---|---|---|
| 2011/0298128 A1* | 12/2011 | Schuetz | H01L 25/50 257/738 |
| 2012/0025396 A1 | 2/2012 | Liao et al. | |
| 2014/0167262 A1 | 6/2014 | Yap | |
| 2016/0322326 A1* | 11/2016 | Katkar | H01L 24/49 |

OTHER PUBLICATIONS

International Search Report and Written Opinion for International Patent Application No. PCT/US2016/069304 dated Sep. 27, 2017, 10 pgs.

* cited by examiner

SEMICONDUCTOR PACKAGE HAVING SINGULAR WIRE BOND ON BONDING PADS

CROSS-REFERENCE TO RELATED APPLICATION

This patent application is a U.S. National Phase Application under 35 U.S.C. § 371 of International Application No. PCT/US2016/069304, filed Dec. 29, 2016, entitled "SEMICONDUCTOR PACKAGE HAVING SINGULAR WIRE BOND ON BONDING PADS," which designates the United States of America, the entire disclosure of which is hereby incorporated by reference in its entirety and for all purposes.

TECHNICAL FIELD

Embodiments are in the field of integrated circuit packages and, in particular, semiconductor packages having vertical wire bond interconnects.

BACKGROUND

Electronic products continue to shrink in size, and the reduction in size of products such as mobile phones demand a similar reduction in the size of internal electronic systems. More particularly, a reduction in thickness of semiconductor packages having active integrated circuit dies can facilitate smaller form factors of the products that are driven by the dies. Certain semiconductor package configurations have emerged as thin packaging options. For example, system-in-package architectures incorporate several integrated circuits within a single module to perform all or most of the functions of an electronic system of a mobile electronics product.

DESCRIPTION OF EMBODIMENTS

Semiconductor packages including active die stacks, and methods of fabricating such semiconductor packages, are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

Thin semiconductor packages can incorporate vertical wire bonds to connect stacked dies embedded within a molding compound to an external component, such as a printed circuit board. Vertical wire bonds can be fabricated by first attaching interconnect wires from the stacked dies to a common bonding area, e.g., on a passive wire carrier, and then grinding material away to segment the interconnect wires into separate and independent vertical wires. As described further below, attaching interconnect wires to a common bonding area can increase manufacturing costs, add to an overall z-height of the semiconductor package, and/or lower manufacturing yields. Accordingly, a super-thin semiconductor package having lower manufacturing costs and increased robustness is needed in the art.

In an aspect, a semiconductor package includes vertical wire bonds fabricated without attaching interconnect wires to a common bonding area or to a passive wire carrier. More particularly, the semiconductor package may be fabricated by bridging between bonding pads on adjacent die stacks using an interconnect wire. The interconnect wire may be divided, e.g., sliced or ground, to form separate wire segments extending vertically from respective bonding pads on separate die stacks. That is, a first die stack may include a first wire segment extending upward from a first bonding pad, and a second die stack may include a second wire segment extending upward from a second bonding pad. Accordingly, the die stacks may be formed without a passive wire carrier and with a singular vertical wire bond on the bonding pads. Thus, fewer components and less mechanical stress may be introduced during the manufacturing process, resulting in a more robust, thinner, semiconductor package at a lower cost.

Figure 1:
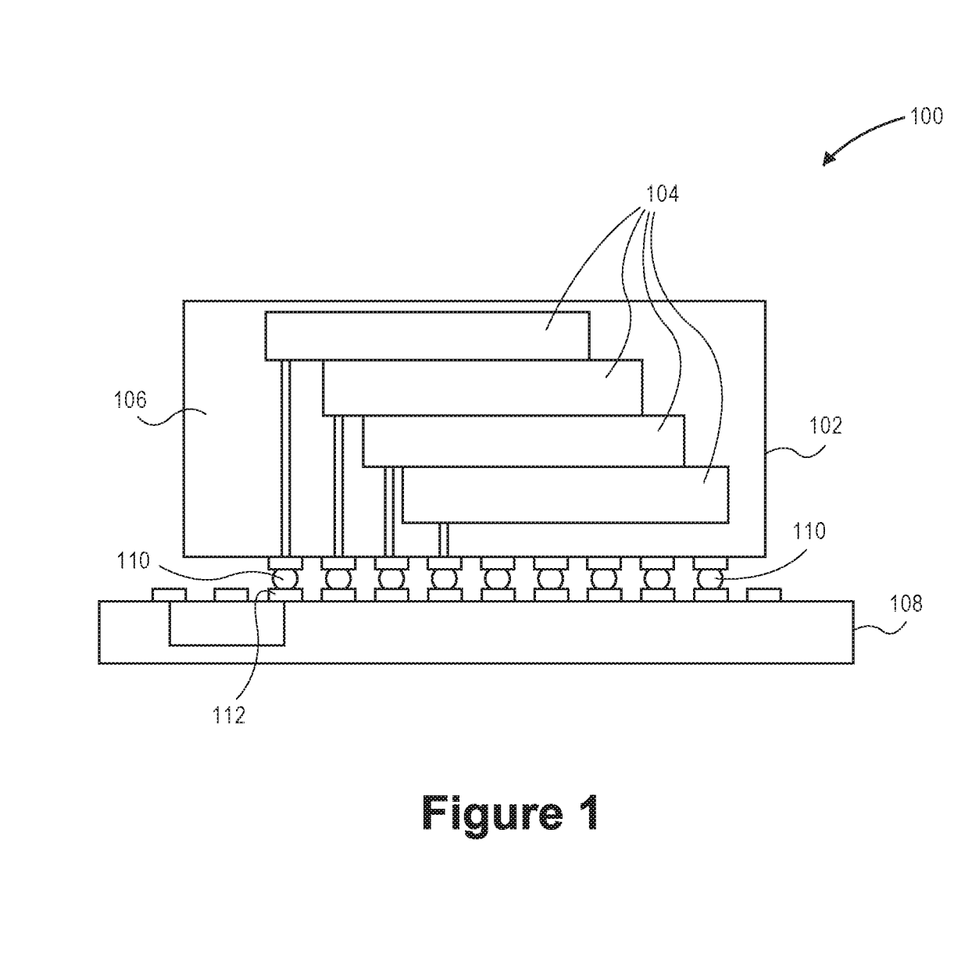
FIG. 1 illustrates a sectional view of a semiconductor package assembly, in accordance with an embodiment.

Referring to FIG. 1, a sectional view of a semiconductor package assembly is illustrated in accordance with an embodiment. A semiconductor package assembly 100 may include one or more semiconductor packages 102 having integrated dies 104 in communication with each other. For example, dies 104 may form a die stack. In an embodiment, semiconductor package 102 is a multi-silicon package having one or more application-specific integrated circuit dies or memory dies embedded in a molding compound 106.

Integrated die(s) 104 may be electrically connected to external components, such as a printed circuit board 108 by intervening solder balls 110. More particularly, semiconductor package 102 of semiconductor package assembly 100 may be a ball grid array (BGA) component having several solder balls 110 arranged in a ball field. That is, an array of solder balls 110 may be arranged in a grid or other pattern.

Each solder ball 110 may be mounted and attached to a corresponding contact pad 112 of printed circuit board 108. Printed circuit board 108 may be a motherboard or another printed circuit board of a computer system or device, e.g., a mobile phone or a flash memory stick. Circuit board 108 may include signal routing to external device connectors (not shown). Accordingly, the solder ball and contact pad attachments may provide a physical and electrical interface between integrated die(s) 104 of semiconductor package 102 and an external device.

Figure 2:
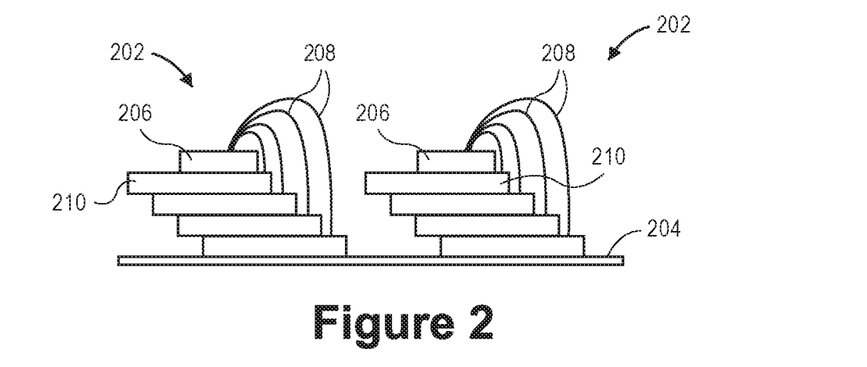
FIG. 2 illustrates a side view of several die stacks having passive wire carriers mounted on a carrier substrate.

Referring to FIG. 2, a side view of several die stacks having passive wire carriers mounted on a carrier substrate is illustrated in accordance with an embodiment. During a manufacturing process, a unit layout may include several die stacks 202 mounted adjacent to one another on a carrier substrate 204. Each die stack 202 may include a wire carrier media, i.e., a passive wire carrier 206, to provide a common bonding area for attaching interconnect wires 208. Passive wire carrier 206 may, for example, be a silicon or thin film attached on a top die 210 of die stack 202. Accordingly, passive wire carrier 206 may provide a connection point for an end of interconnect wires 208 to hold interconnect wires 208 such that interconnect wires 208 extend generally vertically upward from connection points on corresponding dies, e.g., top die 210. It will be appreciated that, since interconnect wires 208 must all be connected to the common bonding area, each die of die stack 202 includes a same type of integrated circuit and/or a same type of material.

Figure 3:
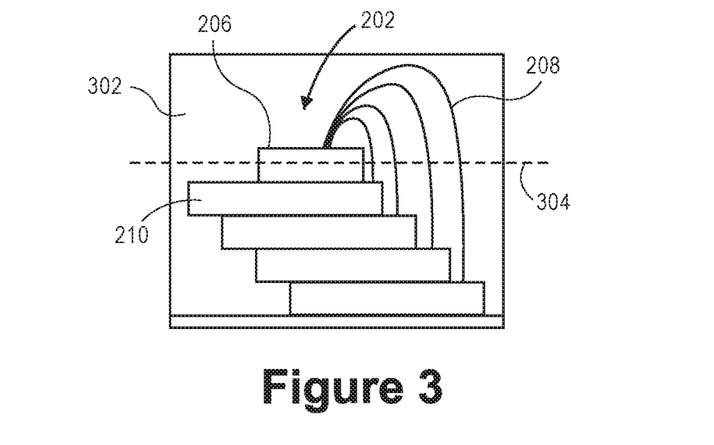
FIG. 3 illustrates sectional views of a die stack having a passive wire carrier.

Referring to FIG. 3, a sectional view of a die stack having a passive wire carrier is illustrated in accordance with an embodiment. In subsequent manufacturing processes, molding compound 302 may be deposited to encapsulate die stack 202, passive wire carrier 206, and interconnect wires 208. The molded component may then be ground to a target thickness. For example, molding compound 302 and interconnect wires 208 may be removed from a top surface downward to a section line 304.

Figure 4:
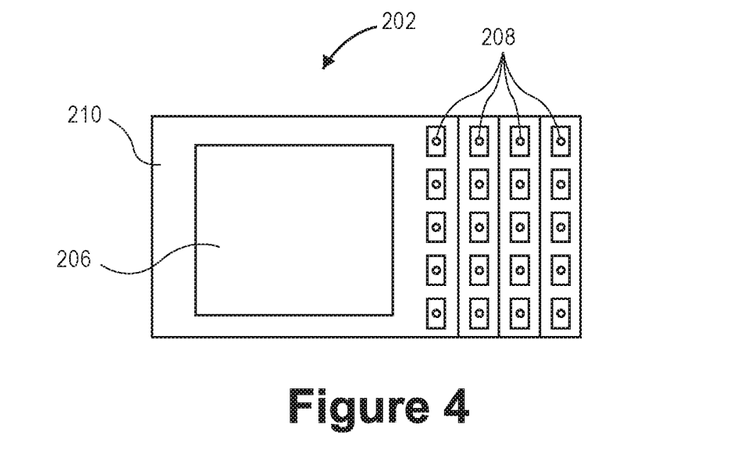
FIG. 4 illustrates a top view of a die stack having a passive wire carrier.

Referring to FIG. 4, a top view of a die stack having a passive wire carrier is illustrated in accordance with an embodiment. Section line 304 may be at a vertical height such that interconnect wires 208 are straight between the top surface of the ground down molding compound 302 and the corresponding die of die stack 202. At such height, section line 204 may be above top die 210. More particularly, section line 304 may be at a vertical height to protect top die 210 by maintaining at least a portion of passive wire carrier 206 on top die 210. As such, a z-height of a semiconductor package incorporating die stack 202 may be thickened by the inclusion of passive wire carrier 210. Accordingly, the semiconductor package may be excluded from use in some packaging applications requiring thinner semiconductor packages. Furthermore, the use of passive wire carrier 210 as a precursor to vertical interconnect wires can introduce added cost to the manufacturing process.

Figure 5:
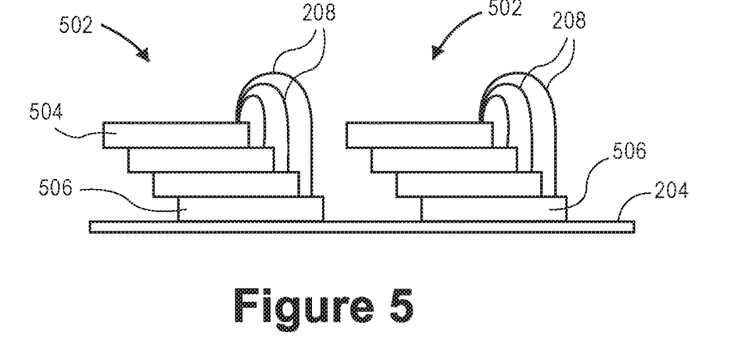
FIG. 5 illustrates a side view of several die stacks including top dies having multiple wire bonds on a bonding pad.

Referring to FIG. 5, a side view of several die stacks including top dies having multiple wire bonds on a bonding pad is illustrated in accordance with an embodiment. During a manufacturing process, a unit layout may include several die stacks 502 mounted adjacent to one another on a carrier substrate 204. Each die stack 502 may include a top die 504 to provide a common bonding area for attaching interconnect wires 208. That is, a bonding pad of top die 504 may provide a connection point for an end of interconnect wires 208 to hold interconnect wires 208 such that interconnect wires 208 extend generally vertically upward from connection points on corresponding dies, e.g., bottom die 506. It will be appreciated that, since interconnect wires 208 must all be connected to the common bonding area, each die of die stack 502 includes a same type of integrated circuit and/or a same type of material.

Figure 6:
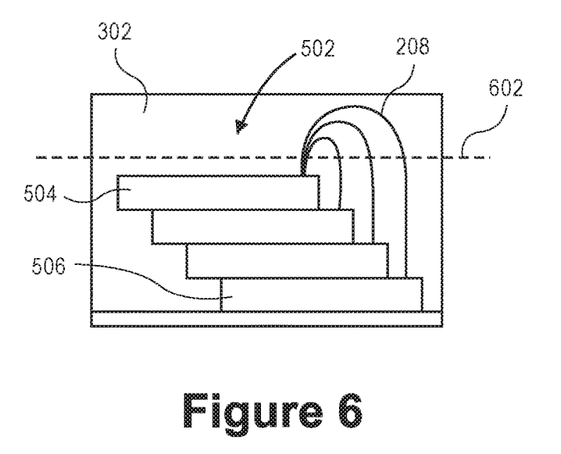
FIG. 6 illustrates sectional views of a die stack including a top die having multiple wire bonds on a bonding pad.

Referring to FIG. 6, a sectional view of a die stack including a top die having multiple wire bonds on a bonding pad is illustrated in accordance with an embodiment. In subsequent manufacturing processes, molding compound 302 may be deposited to encapsulate die stack 502 and interconnect wires 208. The molded component may then be ground to a target thickness. For example, molding compound 302 and interconnect wires 208 may be removed from a top surface downward to a section line 602.

Section line 602 may be at a vertical height such that interconnect wires 208 are straight between the top surface of the ground down molding compound 302 and the corresponding die of die stack 502. For example, remaining segments of interconnect wires 208 may extend straight downward from the top surface to corresponding top die 504 or bottom die 506. Since die stack 502 does not incorporate a passive wire carrier, a z-height of a semiconductor package incorporating die stack 502 may be less than a z-height of a semiconductor package incorporating die stack 202 and passive wire carrier 206 (FIG. 3). Die stack 502, however, has other drawbacks.

Figure 7:
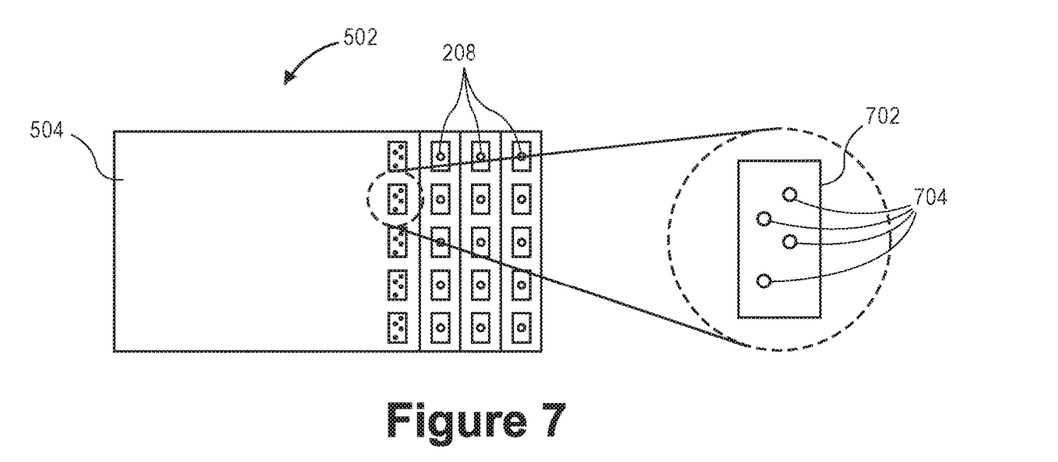
FIG. 7 illustrates a top view of a die stack including a top die having multiple wire bonds on a bonding pad.

Referring to FIG. 7, a top view of a die stack including a top die having multiple wire bonds on a bonding pad is illustrated in accordance with an embodiment. A bonding pad 702 on top die 702 provides a common bonding area for each interconnect wire 208 in a row of interconnections of die stack 502. Bonding pad 702 has multiple bond hits 704, i.e., bonding pad 702 is impacted several times during a wire bonding process. Accordingly, pad damage failure and micro-cracking of an underlying silicon of top die 504 may result. Thus, although die stack 502 can provide a thinner z-height than die stack 202, a semiconductor package incorporating die stack 502 may be less robust and may increase defects per million and reduce manufacturing yields for certain package applications. Furthermore, it will be appreciated that since bonding pad 702 serves as a connection point for an entire row of bonding pads on corresponding dies of die stack 502, each die must have a same number of bonding pads and interconnect wires. Such a requirement limits the applicability of die stack 502 in certain advanced packaging applications, such as multi-silicon-in-package and controller-in-package applications.

The drawbacks described above can be overcome by a semiconductor package solution that does not include passive wire carrier 206 or a bonding pad having multiple wire hits 704. Such a semiconductor package solution can be structured and fabricated as described below.

Figure 8:
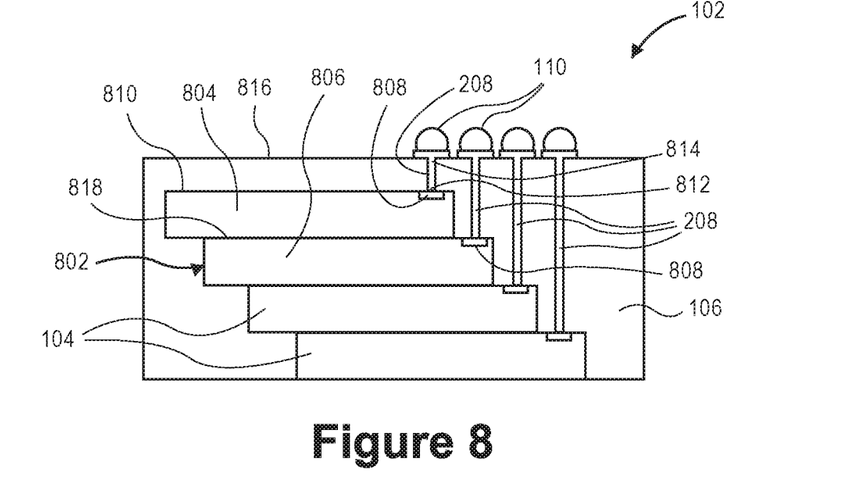
FIG. 8 illustrates a sectional view of a die stack including a top die having a singular wire bond on a bonding pad, in accordance with an embodiment.

Referring to FIG. 8, a sectional view of a die stack including a top die having a singular wire bond on a bonding pad is illustrated in accordance with an embodiment. Semiconductor package 102 may include a die stack 802 having several active dies. An active die is a "live" die having electrical function, such as processing or memory functions. In an embodiment, die stack 802 includes a first active die 804 mounted on a second active die 806. Each active die of die stack 802 may have a different function. For example, first active die 804 may include a first type of integrated circuit, and second active die 806 may include a second type of integrated circuit. By way of example, first active die 804 may be a processor die, and second active die 806 may be a memory die. Accordingly, unlike the solutions described above, semiconductor package 102 having die stack 802 may have dies formed from different materials. That is, first active die 804 may include a first silicon grade, and second active die 806 may include a second silicon grade different than the first silicon grade, e.g., pure silicon for memory die applications. This difference in die types and die materials is allowable because interconnect wires 208 attached to first active die 804 and second active die 806 need not be terminated on a same surface, i.e., on passive wire carrier 206 or bonding pad 702.

Each active die stack 802 may include a respective bonding pad 808 connected to a respective interconnect wire 208. For example, first active die 804 may include a bonding pad 808 on a top surface 810 of the die. By way of example, interconnect wire 208 connected to first active die 804 may include a first end 812 and a second end 814. Interconnect wire 208 may extend vertically and/or straightly between first end 812 and second end 814. For example, first end 812 of interconnect wire 208 may be attached to bonding pad 808 and second end 814 of interconnect wire 208 may be electrically connected to a solder ball 110 mounted on molding compound 106 encapsulating die stack 802, e.g., through under bump metallization. That is, interconnect wire 208 may extend through molding compound 106 from bonding pad 808 to an exposed surface 816 of molding compound 106. Exposed surface 816 may be vertically above top surface 810, and thus, interconnect wire 208 may extend vertically from bonding pad 808 to solder ball 110. When solder ball 110 is connected to contact pad 112 of semiconductor package assembly 100 (FIG. 1), second end 814 of interconnect wire 208 is electrically connected to contact pad 112 through solder ball 110.

As described above, molding compound 106 may encapsulate die stack 802. More particularly, molding compound 106 may be disposed around die stack 802 and interconnect wires 208 such that molding compound 106 covers all of top surface 810. Accordingly, semiconductor package 102 having die stack 802 may be distinguished from a semiconductor package incorporating die stack 202 as shown in FIG. 4 because die stack 802 having top surface 810 entirely covered and in contact with molding compound 106 does not include passive wire carrier 206 between top surface 810 and exposed surface 816.

The structure of interconnect wire 208 attached to first active die 804 may be similarly incorporated into other active dies of die stack 802. For example, first active die 804 may be mounted on a second top surface 818 of second active die 806. In an embodiment, a respective interconnect wire 208 extends vertically from a bonding pad 808 on second top surface 818 to solder ball 110 mounted on exposed surface 816 above the second bonding pad 808. Similar vertical wire bonds may be used for interconnect wires 208 attached to additional integrated dies 104 below first active die 804 or second active die 806.

Figure 9:
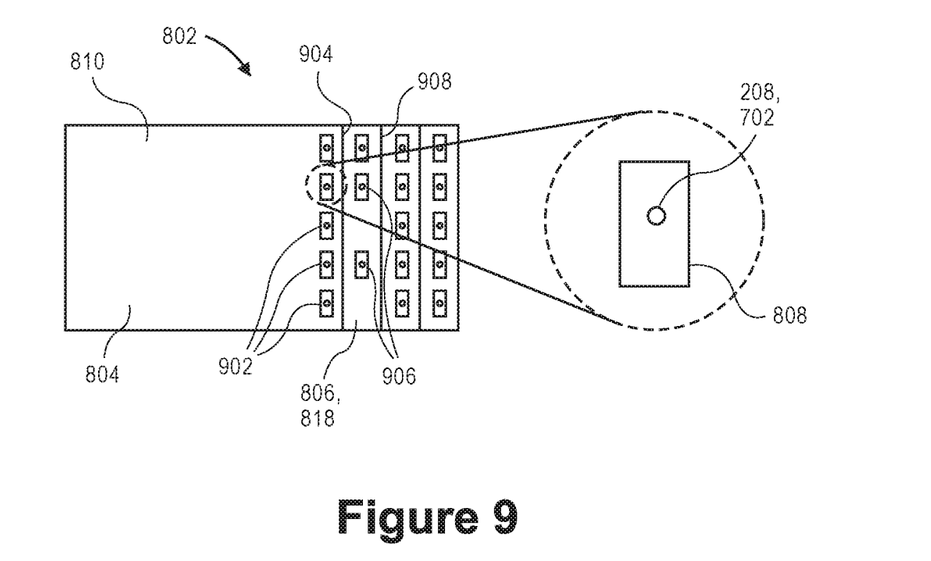
FIG. 9 illustrates a top view of a die stack including a top die having a singular wire bond on a bonding pad and no passive wire carrier, in accordance with an embodiment.

Referring to FIG. 9, a top view of a die stack including a top die having a singular wire bond on a bonding pad and no passive wire carrier is illustrated in accordance with an embodiment. Each active die of die stack 802 may include one or more rows of bonding pads 808 along an outward edge. In an embodiment, first active die 804 includes several first bonding pads 902 along a first lateral edge 904 of top surface 810. First bonding pads 902 may transmit signals between circuitry within a central region of first active die 804. That is, the circuitry within the central region may send and receive electrical signals that are fanned out to first bonding pads 902. Similarly, second active die 806 may include several second bonding pads 906 along a second lateral edge 908 of second top surface 818. As described above, second top surface 818 may support first active die 804. Thus, first active die 804 and second active die 806 may be arranged in a stair-like fashion, such that an exposed area of second top surface 818 is laterally offset from first lateral edge 904. Accordingly, second bonding pads 906 may be disposed on second top surface 818 laterally between first lateral edge 904 and second lateral edge 908.

In an embodiment, each bonding pad 808 of die stack 802 includes a single bond hit 702. More particularly, each bonding pad 808 within the stair-like region of die stack 802 may be attached to only one interconnect wire 208. Interconnect wire 208 may extend vertically upward from bonding pad 808, forming a singular vertical wire bond on bonding pad 808. A method of fabricating such a structure is described below, and several benefits derive from the structure. For example, since each live silicon pad only has one bond hit, stress on the underlying silicon is reduced during the wire bond process of assembly, and both manufacturing yields and product reliability performance may increase.

Flexibility of the design of semiconductor package 102 having die stack 802 incorporating singular vertical wire bonds may also increase. For example, since each bonding pad 808 is attached to only one interconnect wire 208, there is no need for interconnect wires 208 of different active dies to attach to a same common bonding area, and thus, each active die may have a different type of function or material as described above. Furthermore, bonding pad arrangements of first active die 804 and second active die 806 may be asymmetric. That is, first bonding pads 902 aligned in a sequence along first lateral edge 904 may have a different number of bonding pads 808 than second bonding pads 906 aligned in a sequence along second lateral edge 908. Thus, an arrangement of bonding pads 808, e.g., a spacing between bonding pads 808 of a same row, may be varied and adjusted to meet a design intent.

Figure 10:
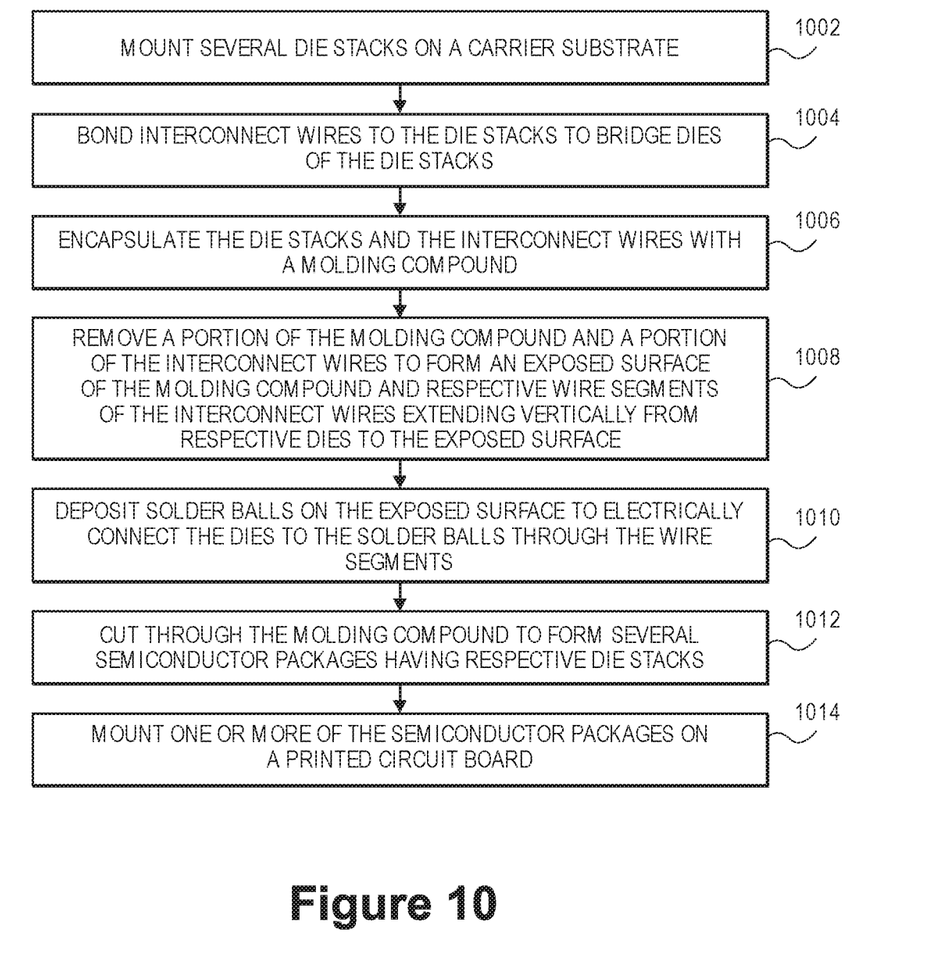
FIG. 10 illustrates a flowchart of a method of fabricating a die stack including a top die having a singular wire bond on a bonding pad and no passive wire carrier, in accordance with an embodiment.
Figure 11A:
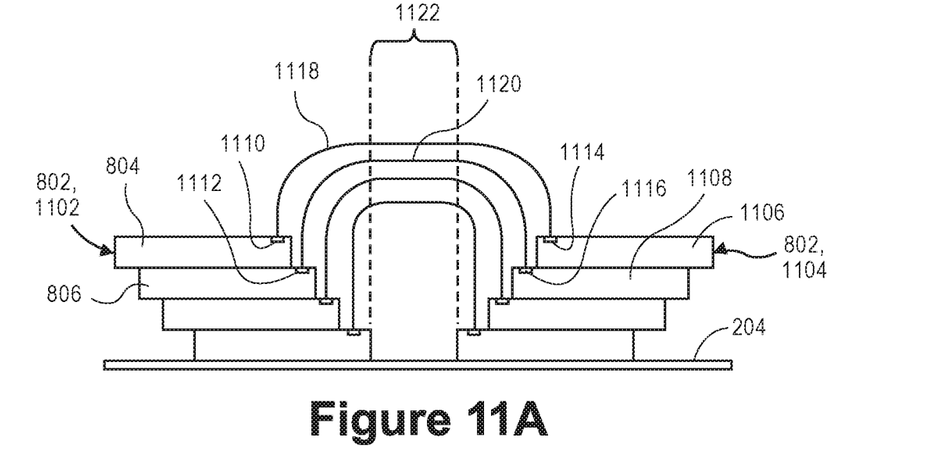
FIGS. 11A-11E illustrate operations in a method of fabricating a die stack including a top die having a singular wire bond on a bonding pad and no passive wire carrier, in accordance with an embodiment.

Referring to FIG. 10, a flowchart of a method of fabricating a die stack including a top die having a singular wire bond on a bonding pad and no passive wire carrier is illustrated in accordance with an embodiment. FIGS. 11A-11E illustrate operations in the method of FIG. 10. Accordingly, FIGS. 10-11E are described in combination below.

At operation 1002, several die stacks are mounted on carrier substrate 204. Referring to FIG. 11A, the active die stacks may have structures similar to that discussed for die stack 802 illustrated in FIGS. 8-9. For example, a first die stack 1102 and a second die stack 1104 may each include several active dies having bonding pads to attach to interconnect wires 208. A unit layout of first die stack 1102 and second die stack 1104 on carrier substrate 204, however, may place the die stacks at 180° to each other. For example, first die stack 1102 may be mounted on carrier substrate 204 such that the stair-like profile ascends in a leftward direction, and second die stack 1104 may be mounted on carrier substrate 204 such that the stair-like profile ascends in a rightward direction.

A design of the unit layout, which couples every two die stack units as a side-by-side pair mirrored about a vertical plane between the units, may allow interconnect wires 208 to extend from one die stack to another. First die stack 1102 may include first active die 804 mounted on second active die 806. Similarly, second die stack 1104 may include a third active die 1106 mounted on a fourth active die 1108. Each active die may include one or more bonding pads arranged along a lateral edge, e.g., an edge of a sidewall forming the stair-like structure. For example, first active die 804 may include a first bonding pad 1110, second active die 806 may include a second bonding pad 1112, third active die 1106 may include a third bonding pad 1114, and fourth active die 1108 may include a fourth bonding pad 1116.

At operation 1004, interconnect wires 208 may be bonded to first die stack 1102 and second die stack 1104 to bridge between respective dies of the die stacks. For example, a first interconnect wire 1118 may have an end attached to first bonding pad 1110 and another end attached to third bonding pad 1114, such that first interconnect wire 1118 extends between first bonding pad 1110 and third bonding pad 1114. Similarly, a second interconnect wire 1120 may have an end attached to second bonding pad 1112 and another end attached to fourth bonding pad 1116 such that second interconnect wire 1120 extends between second bonding pad 1112 and fourth bonding pad 1116. Accordingly, only one end of each interconnect wire 208 may be attached to a respective die stack 802. That is, one end of each interconnect wire 208 may be attached to first die stack 1102, and another end of the interconnect wire 208 may be attached to second die stack 1104. As such, each interconnect wire 208 may extend laterally across a medial region 1122 between first die stack 1102 from second die stack 1104.

Figure 11B:
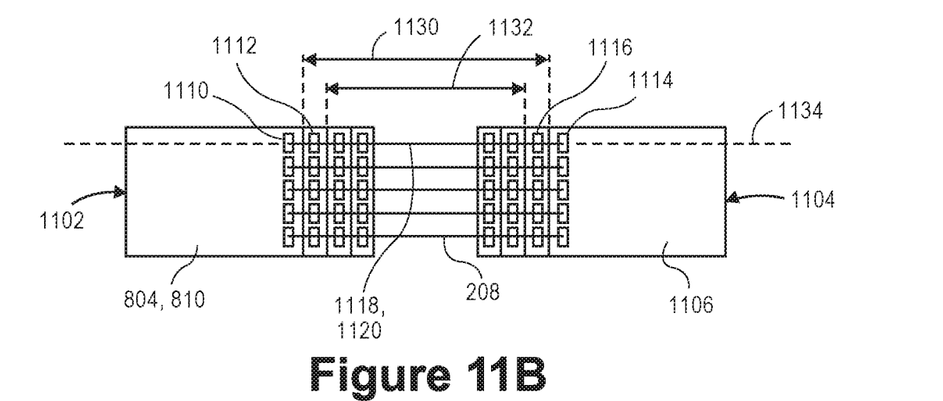

Referring to FIG. 11B, medial region 1122 and/or lateral distances between corresponding active dies of the adjacent die stacks may increase in relation to a vertical height from carrier substrate 204. For example, a distance between first active die 804 and third active die 1106 may be greater than a distance between the bottom dies of the adjacent die stacks due to first die stack 1102 being mirrored relative to second die stack 1104. More particularly, a first lateral distance 1130 between first bonding pad 1110 and third bonding pad 1114 may be greater than a second lateral distance 1132 between second bonding pad 1112 and fourth bonding pad 1116.

Interconnect wires 208 extending laterally between first die stack 1102 and second die stack 1104 may be aligned in a vertical direction. For example, a column of bonding pads along the staircase of each active die of first die stack 1102 and second die stack 1104 may be aligned along a vertical plane 1134. That is, vertical plane 1134 may be orthogonal to the top surface 810 of first active die 804 and extend laterally through first bonding pad 1110, second bonding pad 1112, third bonding pad 1114, and fourth bonding pad 1116. Accordingly, first interconnect wire 1118 and second interconnect wire 1120 may extend between die stacks within vertical plane 1134, and thus, may be aligned in a vertical direction.

Figure 11C:
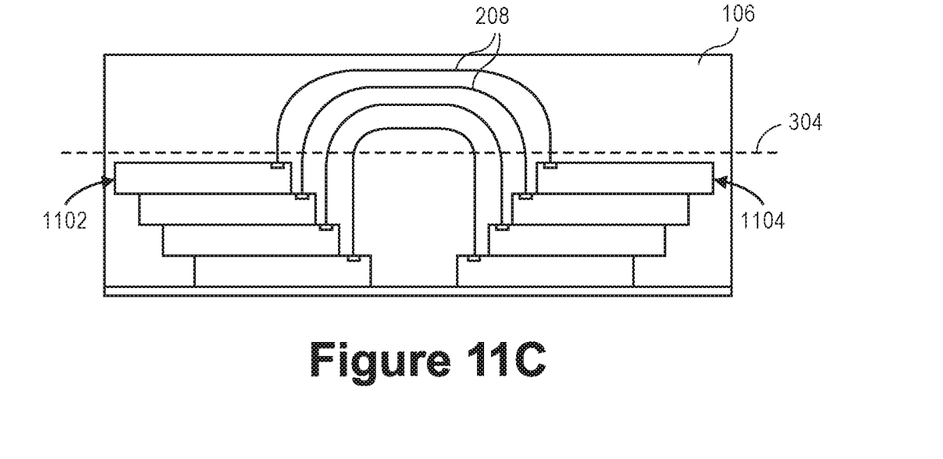

At operation 1006, the interconnected die stacks may be encapsulated by molding compound 106. Referring to FIG. 11C, molding compound 106 may be deposited over first die stack 1102, second die stack 1104, and interconnect wires 208. Molding compound 106 may fill medial region 1122 between first die stack 1102 and second die stack 1104. Accordingly, the vertical wire bonds of each interconnect wire 208 and the lateral segments of each interconnect wire 208 extending across medial region 1122 may be surrounded by molding compound 106.

At operation 1008, a portion of the deposited molding compound 106 may be removed. For example, molding compound 106 may be ground downward to section line 304. Grinding of molding compound 106 may remove a portion of molding compound 106 over die stacks 1102, 1104. Furthermore, grinding of molding compound 106 may remove a portion of interconnect wires 208 within medial region 1122. That is, the portion of interconnect wires 208 above section line 304 may be removed. For example, the lateral segments of interconnect wires 208 bridging between first die stack 1102 and second die stack 1104 may be removed.

Figure 11D:
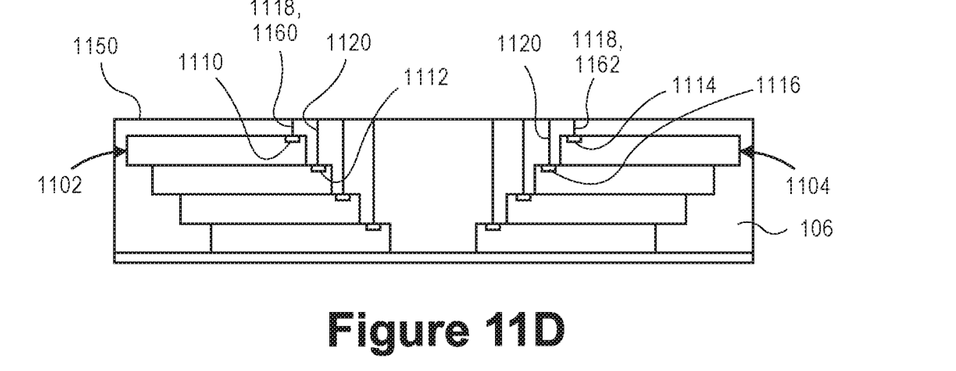
Figure 11E:
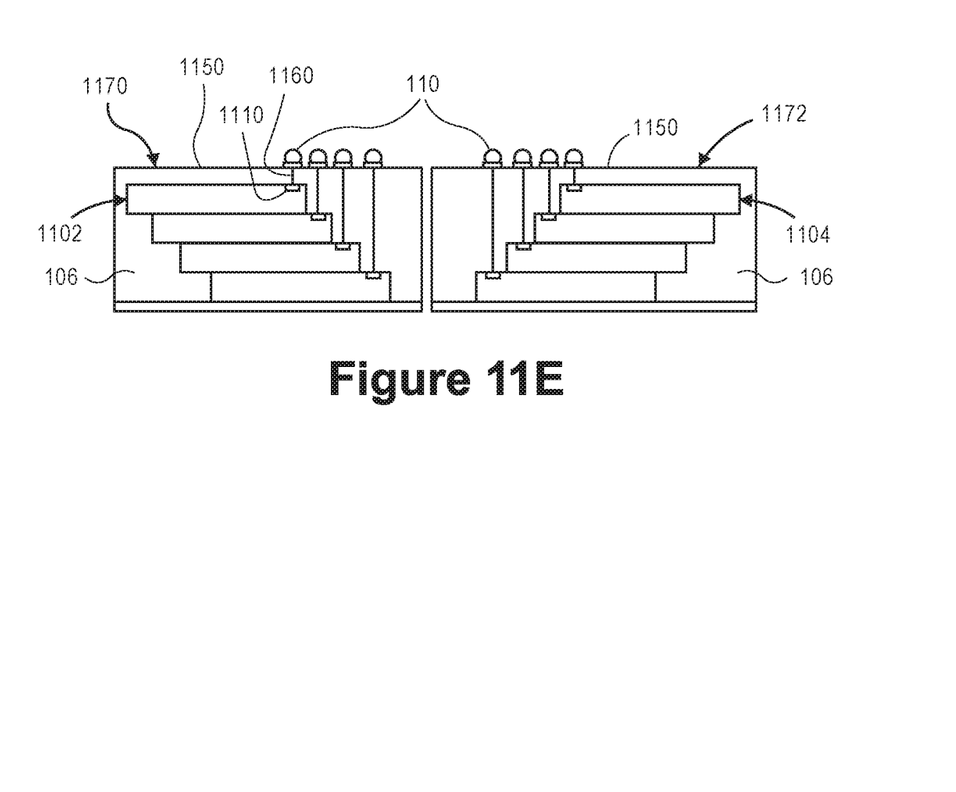

Referring to FIG. 11D, removal of molding compound 106 to section line 304 may form an exposed surface 1150 of molding compound 106 vertically above first die stack 1102 and second die stack 1104. Furthermore, removal of molding compound 106 to section line 304 may divide each interconnect wire 208 into several wire segments. For example, first interconnect wire 1118 may be divided into a first wire segment 1160 attached to first bonding pad 1110 and a second wire segment 1162 attached to third bonding pad 1114. Similarly, second interconnect wire 1120 may be divided into wire segments attached to second bonding pad 1112 and fourth bonding pad 1116. Each wire segment may extend vertically from the respective bonding pad to exposed surface 1150. Each wire segment may form a singular vertical wire bond. Accordingly, embedded die stacks having singular vertical wire bonds may be formed.

At operation 1010, solder balls 110 may be deposited on exposed surface 1150 of molding compound 106. As described above, each wire segment may extend vertically from a respective bonding pad to a respective solder ball 110. For example, first wire segment 1160 may electrically connect first bonding pad 1110 to solder ball 110. Connection may be made through under bump metallization.

At operation 1012, a vertical cut may be made through molding compound 106 to form several semiconductor packages 102 having respective die stacks. More particularly, the pair of die stacks may be divided to form a first semiconductor package 1170 having first die stack 1102 and a second semiconductor package 1172 having second die stack 1104.

At operation 1014, one or more of first semiconductor package 1170 or second semiconductor package 1172 may be mounted on printed circuit board 108 to form semiconductor package assembly 100. For example, solder ball 110 may be attached to contact pad 112 of printed circuit board 108. Accordingly, first bonding pad 1110 may be electrically connected to contact pad 112 through the singular vertical wire bond of first wire segment 1160 and solder ball 110. Carrier substrate 204 may be removed from semiconductor packages 1170, 1172 before or after mounting on printed circuit board 108.

Figure 12:
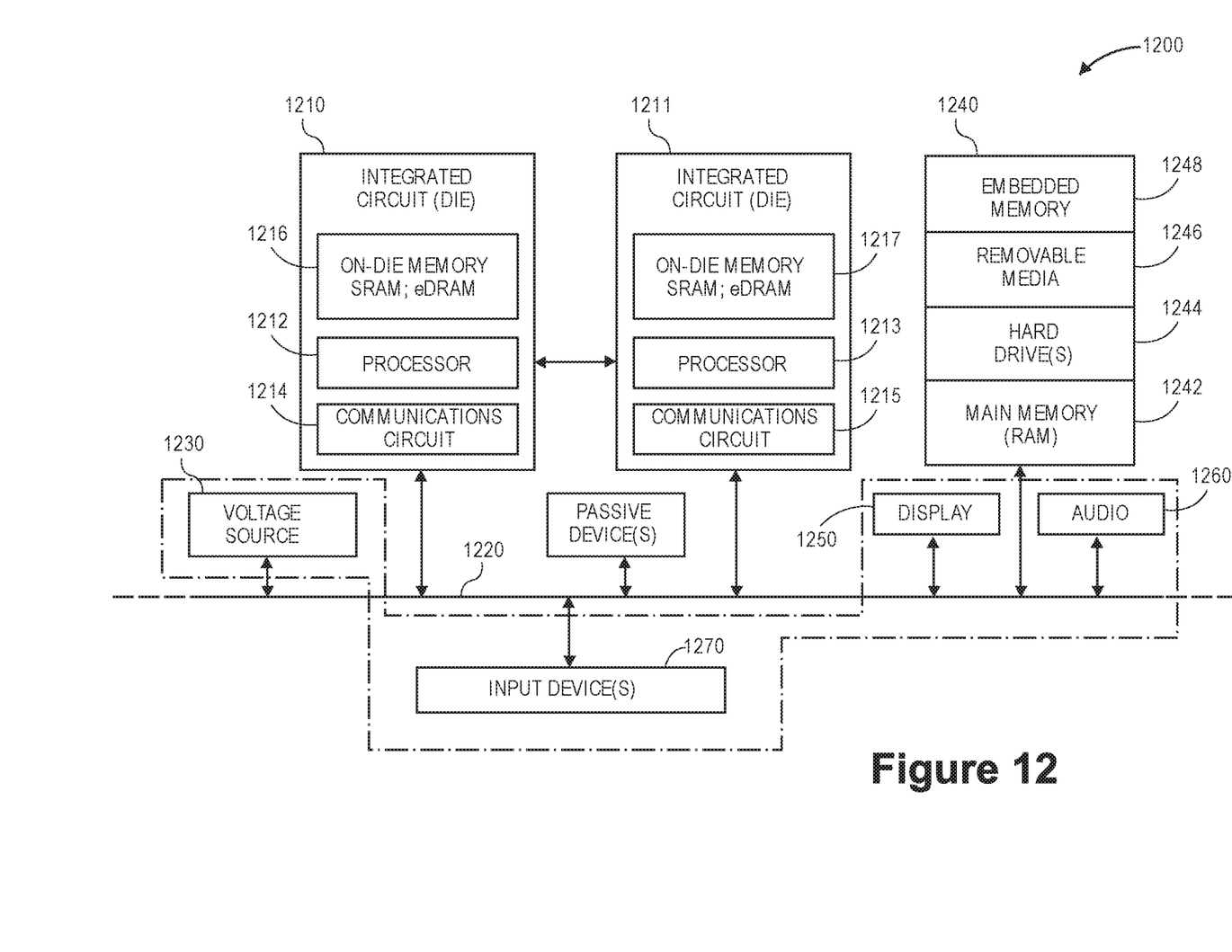
FIG. 12 is a schematic of a computer system, in accordance with an embodiment.

FIG. 12 is a schematic of a computer system, in accordance with an embodiment. The computer system 1200 (also referred to as the electronic system 1200) as depicted can embody a semiconductor package including active die stacks, according to any of the several disclosed embodiments and their equivalents as set forth in this disclosure. The computer system 1200 may be a mobile device such as a netbook computer. The computer system 1200 may be a mobile device such as a wireless smart phone. The computer system 1200 may be a desktop computer. The computer system 1200 may be a hand-held reader. The computer system 1200 may be a server system. The computer system 1200 may be a supercomputer or high-performance computing system.

In an embodiment, the electronic system 1200 is a computer system that includes a system bus 1220 to electrically couple the various components of the electronic system 1200. The system bus 1220 is a single bus or any combination of busses according to various embodiments. The electronic system 1200 includes a voltage source 1230 that provides power to the integrated circuit 1210. In some embodiments, the voltage source 1230 supplies current to the integrated circuit 1210 through the system bus 1220.

The integrated circuit 1210 is electrically coupled to the system bus 1220 and includes any circuit, or combination of circuits according to an embodiment. In an embodiment, the integrated circuit 1210 includes a processor 1212 that can be of any type. As used herein, the processor 1212 may mean any type of circuit such as, but not limited to, a microprocessor, a microcontroller, a graphics processor, a digital signal processor, or another processor. In an embodiment, the processor 1212 includes, or is coupled with, a semiconductor package including an active die stack, as disclosed herein. In an embodiment, SRAM embodiments are found in memory caches of the processor. Other types of circuits that can be included in the integrated circuit 1210 are a custom circuit or an application-specific integrated circuit (ASIC), such as a communications circuit 1214 for use in wireless devices such as cellular telephones, smart phones, pagers, portable computers, two-way radios, and similar electronic systems, or a communications circuit for servers. In an embodiment, the integrated circuit 1210 includes on-die memory 1216 such as static random-access memory (SRAM). In an embodiment, the integrated circuit 1210 includes embedded on-die memory 1216 such as embedded dynamic random-access memory (eDRAM).

In an embodiment, the integrated circuit 1210 is complemented with a subsequent integrated circuit 1211. Useful embodiments include a dual processor 1213 and a dual communications circuit 1215 and dual on-die memory 1217 such as SRAM. In an embodiment, the dual integrated circuit 1211 includes embedded on-die memory 1217 such as eDRAM.

In an embodiment, the electronic system 1200 also includes an external memory 1240 that in turn may include one or more memory elements suitable to the particular application, such as a main memory 1242 in the form of RAM, one or more hard drives 1244, and/or one or more drives that handle removable media 1246, such as diskettes, compact disks (CDs), digital variable disks (DVDs), flash memory drives, and other removable media known in the art. The external memory 1240 may also be embedded memory 1248 such as the first die in a die stack, according to an embodiment.

In an embodiment, the electronic system 1200 also includes a display device 1250, and an audio output 1260. In an embodiment, the electronic system 1200 includes an input device such as a controller 1270 that may be a keyboard, mouse, trackball, game controller, microphone, voice-recognition device, or any other input device that inputs information into the electronic system 1200. In an embodiment, an input device 1270 is a camera. In an embodiment, an input device 1270 is a digital sound recorder. In an embodiment, an input device 1270 is a camera and a digital sound recorder.

As shown herein, the integrated circuit 1210 can be implemented in a number of different embodiments, including a semiconductor package including an active die stack, according to any of the several disclosed embodiments and their equivalents, an electronic system, a computer system, one or more methods of fabricating an integrated circuit, and one or more methods of fabricating an electronic assembly that includes a semiconductor package including an active die stack, according to any of the several disclosed embodiments as set forth herein in the various embodiments and their art-recognized equivalents. The elements, materials, geometries, dimensions, and sequence of operations can all be varied to suit particular 110 coupling requirements including array contact count, array contact configuration for a microelectronic die embedded in a processor mounting substrate according to any of the several disclosed semiconductor packages including an active die stack embodiments and their equivalents. A foundation substrate may be included, as represented by the dashed line of FIG. 12. Passive devices may also be included, as is also depicted in FIG. 12.

Embodiments of a semiconductor package including an active die stack are described above. In an embodiment, a semiconductor package, includes a die stack including a first active die mounted on a second active die. The first active die includes a bonding pad on a top surface. The semiconductor package includes an interconnect wire having a first end attached to the bonding pad. The interconnect wire is an only wire attached to the bonding pad. The semiconductor package includes a molding compound around the die stack and the interconnect wire. The molding compound covers all of the top surface.

In one embodiment, the first active die includes a first type of integrated circuit. The second active die includes a second type of integrated circuit.

In one embodiment, the first active die includes a first silicon grade. The second active die includes a second silicon grade different than the first silicon grade.

In one embodiment, the first active die is a processor die. The second active die is a memory die.

In one embodiment, the molding compound includes an exposed surface vertically above the top surface. The semiconductor package includes a solder ball mounted on the exposed surface. The interconnect wire has a second end electrically connected to the solder ball.

In one embodiment, the semiconductor package does not include a passive wire carrier between the top surface and the exposed surface.

In one embodiment, the first active die includes several first bonding pads along a first lateral edge of the top surface. The second active die has a second top surface and includes several second bonding pads along a second lateral edge of the second top surface. The several second bonding pads are laterally between the first lateral edge and the second lateral edge.

In one embodiment, the several first bonding pads have a different number of bonding pads than the several second bonding pads.

In an embodiment, a semiconductor package assembly includes a printed circuit board. The semiconductor package assembly includes a semiconductor package mounted on the printed circuit board. The semiconductor package includes a first active die including a bonding pad on a top surface, a second active die under the first active die, an interconnect wire having a first end attached to the bonding pad, and a molding compound surrounding the first active die, the second active die, and the interconnect wire. The interconnect wire is an only wire attached to the bonding pad. The molding compound covers all of the top surface.

In one embodiment, the first active die is a first type of integrated circuit. The second active die is a second type of integrated circuit.

In one embodiment, the first active die includes a first silicon grade. The second active die includes a second silicon grade different than the first silicon grade.

In one embodiment, the printed circuit board includes a contact pad. The molding compound includes an exposed surface vertically above the top surface. The semiconductor package assembly includes a solder ball between the exposed surface and the contact pad. The interconnect wire has a second end electrically connected to the contact pad through the solder ball.

In one embodiment, the semiconductor package does not include a passive die between the top surface and the exposed surface.

In one embodiment, the first active die includes several first bonding pads. The second active die includes several second bonding pads. The several first bonding pads have a different number of bonding pads than the several second bonding pads.

In an embodiment, a method of fabricating a die stack including a top die having a singular wire bond on a bonding pad and no passive wire carrier includes mounting a first die stack on a carrier substrate. The first die stack includes a first active die mounted on a second active die. The first active die includes a first bonding pad. The second active die includes a second bonding pad. The method includes mounting a second die stack on the carrier substrate. The second die stack includes a third active die mounted on a fourth active die. The third active die includes a third bonding pad. The fourth active die includes a fourth bonding pad. The method includes bonding several interconnect wires to the die stacks. The first interconnect wire extends between the first bonding pad and the third bonding pad. A second interconnect wire extends between the second bonding pad and the fourth bonding pad. The method includes depositing a molding compound over the first die stack, the second die stack, and the interconnect wires. The molding compound fills a medial region between the first die stack and the second die stack.

In one embodiment, the method includes removing a portion of the molding compound over the die stacks, and a portion of the interconnect wires within the medial region such that the molding compound includes an exposed surface vertically above the die stacks and the interconnect wires include respective wire segments extending vertically from respective bonding pads to the exposed surface.

In one embodiment, the method includes cutting through the molding compound in the medial region to form a first semiconductor package having the first die stack and a second semiconductor package having the second die stack.

In one embodiment, the method includes depositing a solder ball on the exposed surface. A first wire segment of the first interconnect wire electrically connects the first bonding pad to the solder ball. The method includes attaching the solder ball to a contact pad of a printed circuit board.

In one embodiment, a first lateral distance between the first bonding pad and the third bonding pad is greater than a second lateral distance between the second bonding pad and the fourth bonding pad.

In one embodiment, the several interconnect wires are aligned within a vertical plane extending through the bonding pads.

What is claimed is:

1. A semiconductor package, comprising:
a die stack including a first active die mounted on a second active die, and the die stack including a third active die mounted on the second active die, wherein the first active die includes a first bonding pad on a first top surface, wherein the second active die includes a second bonding pad on a second top surface, and wherein the third active die includes a third bonding pad on a third top surface;
a first interconnect wire having a first end attached to the first bonding pad, wherein the first interconnect wire is an only wire attached to the first bonding pad;
a second interconnect wire having a first end attached to the second bonding pad, wherein the second interconnect wire is an only wire attached to the second bonding pad;
a plurality of interconnect wires each having a first end attached to the third bonding pad;
a first solder ball coupled to the first interconnect wire, the first solder ball vertically over the first bonding pad, wherein the first interconnect wire extends vertically from the first bonding pad to the first solder ball;
a second solder ball coupled to the second interconnect wire, the second solder ball vertically over the second bonding pad, wherein the second interconnect wire extends vertically from the second bonding pad to the second solder ball; and
a molding compound around the die stack and the first interconnect wire and the second interconnect wire and the plurality of interconnect wires, wherein the molding compound covers all of the first top surface and the second top surface and the third top surface.

2. The semiconductor package of claim 1, wherein the first active die includes a first type of integrated circuit, and wherein the second active die includes a second type of integrated circuit.

3. The semiconductor package of claim 2, wherein the first active die includes a first silicon grade, and wherein the second active die includes a second silicon grade different than the first silicon grade.

4. The semiconductor package of claim 3, wherein the first active die is a processor die, and wherein the second active die is a memory die.

5. The semiconductor package of claim 1, wherein the molding compound includes an exposed surface the first solder ball and the second solder ball mounted on the exposed surface.

6. The semiconductor package of claim 5, wherein the semiconductor package does not include a passive wire carrier between the first top surface and the exposed surface.

7. The semiconductor package of claim 1, wherein the first active die includes a first plurality of bonding pads along a first lateral edge of the top surface, wherein the second active die has a second top surface and includes a second plurality of bonding pads along a second lateral edge of the second top surface, and wherein the second plurality of bonding pads are laterally between the first lateral edge and the second lateral edge.

8. The semiconductor package of claim 7, wherein the first plurality of bonding pads has a different number of bonding pads than the second plurality of bonding pads.

9. A semiconductor package assembly, comprising:
a printed circuit board; and
a semiconductor package mounted on the printed circuit board, the semiconductor package including:
a first active die including a first bonding pad on a first top surface, a second active die mounted under the first active die, the second active die including a second bonding pad on a second top surface, and a third active die mounted under the second active die, the third active die including a third bonding pad on a third top surface, a first interconnect wire having a first end attached to the first bonding pad, wherein the first interconnect wire is an only wire attached to the first bonding pad, a second interconnect wire having a first end attached to the second bonding pad, wherein the second interconnect wire is an only wire attached to the second bonding pad, a plurality of interconnect wires each having a first end attached to the third bonding pad, a first solder ball coupled to the first interconnect wire, the first solder ball vertically over the first bonding pad, wherein the first interconnect wire extends vertically from the first bonding pad to the first solder ball, a second solder ball coupled to the second interconnect wire, the second solder ball vertically over the second bonding pad, wherein the second interconnect wire extends vertically from the second bonding pad to the second solder ball, and a molding compound surrounding the first active die, the second active die, the third active die, and the first interconnect wire and the second interconnect wire and the plurality of interconnect wires, wherein the molding compound covers all of the first top surface and the second top surface and the third top surface.

10. The semiconductor package assembly of claim 9, wherein the first active die is a first type of integrated circuit, and wherein the second active die is a second type of integrated circuit.

11. The semiconductor package assembly of claim 10, wherein the first active die includes a first silicon grade, and wherein the second active die includes a second silicon grade different than the first silicon grade.

12. The semiconductor package assembly of claim 9, wherein the printed circuit board includes a contact pad, and wherein the molding compound includes an exposed surface vertically above the top surface, wherein the first interconnect wire has a second end electrically connected to the contact pad through the first solder ball.

13. The semiconductor package assembly of claim 12, wherein the semiconductor package does not include a passive die between the first top surface and the exposed surface.

14. The semiconductor package assembly of claim 9, wherein the first active die includes a first plurality of bonding pads, wherein the second active die includes a second plurality of bonding pads, and wherein the first plurality of bonding pads has a different number of bonding pads than the second plurality of bonding pads.

15. A method, comprising:
mounting a first die stack on a carrier substrate, wherein the first die stack includes a first active die mounted on a second active die, the second active die mounted on a third active die, wherein the first active die includes a first bonding pad, wherein the second active die includes a second bonding pad, and wherein the third active die includes a third bonding pad;
mounting a second die stack on the carrier substrate, wherein the second die stack includes a fourth active die mounted on a fifth active die, the fifth active die mounted on a sixth active die, wherein the fourth active die includes a fourth bonding pad, wherein the fifth active die includes a fifth active die, and wherein the sixth active die includes a sixth bonding pad;
bonding a plurality of interconnect wires to the die stacks, wherein a first interconnect wire extends between the first bonding pad and the fourth bonding pad continuous from the first bonding pad to the fourth bonding pad, wherein a second interconnect wire extends between the second bonding pad and the fifth bonding pad continuous from the second bonding pad to the fifth bonding pad, and wherein a third interconnect wire extends between the third bonding pad and the sixth bonding pad continuous from the third bonding pad to the sixth bonding pad;
depositing a molding compound over the first die stack, the second die stack, and the interconnect wires, wherein the molding compound fills a medial region between the first die stack and the second die stack; and
removing a portion of the molding compound from over the die stacks and a portion of the interconnect wires within the medial region such that the molding compound includes an exposed surface vertically above the die stacks, wherein removing the portion of the molding compound from over the die stacks and the portion of the interconnect wires within the medial region breaks a continuity of the first interconnect wire, breaks a continuity of the second interconnect wire, and breaks a continuity of the third interconnect wire.

16. The method of claim 15, wherein
the interconnect wires include respective wire segments extending vertically from respective bonding pads to the exposed surface.

17. The method of claim 16 further comprising: cutting through the molding compound in the medial region to form a first semiconductor package having the first die stack and a second semiconductor package having the second die stack.

18. The method of claim 17 further comprising:
depositing a solder ball on the exposed surface, wherein a first wire segment of the first interconnect wire electrically connects the first bonding pad to the solder ball; and attaching the solder ball to a contact pad of a printed circuit board.

19. The method of claim 15, wherein a first lateral distance between the first bonding pad and the third bonding pad is greater than a second lateral distance between the second bonding pad and the fourth bonding pad.

20. The method of claim 19, wherein the plurality of interconnect wires are aligned within a vertical plane extending through the bonding pads.

* * * * *